(12) United States Patent
Miyazoe et al.

(10) Patent No.: US 11,177,319 B2
(45) Date of Patent: Nov. 16, 2021

(54) RRAM DEVICE WITH SPACER FOR ELECTRODE ISOLATION

(71) Applicant: International Business Machines Corporation, Armonk, NY (US)

(72) Inventors: Hiroyuki Miyazoe, White Plains, NY (US); Iqbal Rashid Saraf, Cobleskill, NY (US); Dexin Kong, Guilderland, NY (US); Takashi Ando, Tuckahoe, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 17 days.

(21) Appl. No.: 16/408,865

(22) Filed: May 10, 2019

(65) Prior Publication Data
US 2020/0357852 A1    Nov. 12, 2020

(51) Int. Cl.
*H01L 27/24* (2006.01)
*H01L 45/00* (2006.01)

(52) U.S. Cl.
CPC ...... *H01L 27/2436* (2013.01); *H01L 45/1206* (2013.01); *H01L 45/1233* (2013.01); *H01L 45/1253* (2013.01); *H01L 45/16* (2013.01)

(58) Field of Classification Search
CPC .......... H01L 45/1206; H01L 45/1233; H01L 45/1253; H01L 45/16; H01L 27/2436
See application file for complete search history.

(56) References Cited

U.S. PATENT DOCUMENTS

| 9,099,647 | B2 | 8/2015 | Liao et al. | |
| 9,543,511 | B2 | 1/2017 | Sung et al. | |
| 9,799,705 | B1 | 10/2017 | Yi et al. | |
| 9,853,091 | B2 | 10/2017 | Chou et al. | |
| 2016/0268505 | A1* | 9/2016 | Sung | H01L 45/146 |
| 2017/0309682 | A1* | 10/2017 | Chou | H01L 45/146 |
| 2019/0252606 | A1* | 8/2019 | Pirovano | G11C 13/0097 |

(Continued)

FOREIGN PATENT DOCUMENTS

| CN | 104347631 A | 2/2015 |
| WO | 2018022027 A1 | 2/2018 |

OTHER PUBLICATIONS

Authors et. al., Disclosed Anonymously, "Method and System for Fabricating Non-Volatile Floating Gate Structure with Superior Charge Retention," IP.com No. IPCOM000197737D:IP.com Electronic Publication Date: Jul. 20, 2010 (4 pages).

(Continued)

*Primary Examiner* — Shaun M Campbell
(74) *Attorney, Agent, or Firm* — Cantor Colburn LLP; Randall Bluestone

(57) ABSTRACT

Embodiments of the present invention are directed to forming a Resistive Random Access Memory (RRAM) device with a spacer for electrode isolation. In a non-limiting embodiment of the invention, a memory stack including a top electrode, a bottom electrode, and a dielectric layer between the top electrode and the bottom electrode is formed. A portion of the memory stack is removed to expose a sidewall of the top electrode and a spacer is formed on the sidewall of the top electrode. The spacer is positioned to encapsulate the top electrode, physically preventing a short between the top electrode and the bottom electrode.

10 Claims, 15 Drawing Sheets

(56) References Cited

U.S. PATENT DOCUMENTS

2020/0127053 A1* 4/2020 Chen ................ H01L 27/11507
2020/0403146 A1* 12/2020 Ku ........................ H01L 27/228

OTHER PUBLICATIONS

Tyson York Winarski, "Dielectrics in MOS Devices, DRAM Capacitors, and Inter-Metal Isolation," Deis Feature Article. IEEE Electrical Insulation Magazine, vol. 17, No. 6, Nov./Dec. 2001; pp. 35-47.

* cited by examiner

RRAM DEVICE WITH SPACER FOR ELECTRODE ISOLATION

BACKGROUND

The present invention generally relates to fabrication methods and resulting structures for semiconductor devices, and more specifically, to forming a Resistive Random Access Memory (RRAM) device with a spacer for electrode isolation.

As the functionality of integrated chips increases, the need for more memory does as well. For example, analog memory devices (e.g., RRAMs) are now being used to build neuromorphic hardware accelerators for deep learning (AI) applications. In response, designers have been looking to decrease the size of the memory elements and to stack more memory elements in a unit area to achieve greater capacity and lower costs per bit. With advancements in lithographic techniques, significant shrinkage of memory elements has been achieved. For example, flash memory can achieve high density by using 3D arrays, such as using vertical NAND cell stacking. Due to its high density, flash memory has been widely used as a large-capacity, nonvolatile memory, which can store data when it is powered off. However, it has been found that further miniaturization of the flash memory is limited as production costs have become increasingly high.

Designers are now looking at next generation nonvolatile memories such as MRAMs (Magnetoresistive Random Access Memory), PCRAMs (Phase Change Random Access Memory), CBRAMs (Conductive Bridging Random Access Memory) and RRAMs (Resistive Random Access Memory), to increase writing speed and decrease power consumption. Among the nonvolatile memories, RRAM has the most potential to replace flash memories due to its simple structure, simple crossbar array, and suitability to low-temperature fabrication. A unit element of the RRAM is a two-terminal device composed of only an insulator positioned between two metal electrodes. For example, a memristor element (e.g., HfOx) can be sandwiched between two electrodes. Defects (e.g., oxygen vacancies) are intentionally introduced in the memristor film so that the memristor can be programmed to different logic states, such as a low-resistance state (logic "1") or a high-resistance state (logic "0"), by changing the polarity of an electrical field across the memristor element.

SUMMARY

Embodiments of the invention are directed to a method for forming an RRAM device with a spacer for electrode isolation. A non-limiting example of the method includes forming a memory stack including a top electrode, a bottom electrode, and a dielectric layer between the top electrode and the bottom electrode. A portion of the memory stack is removed to expose a sidewall of the top electrode and a spacer is formed on the sidewall of the top electrode. The spacer is positioned to encapsulate the top electrode, preventing a short between the top electrode and the bottom electrode.

Embodiments of the invention are directed to a method for forming an RRAM device with a spacer for electrode isolation. A non-limiting example of the method includes forming a memory stack including a top electrode, a bottom electrode, and a dielectric layer between the top electrode and the bottom electrode. A portion of the memory stack is removed to expose a sidewall of the top electrode and a sidewall of the dielectric layer. A spacer is formed on the sidewall of the top electrode. The spacer is positioned to encapsulate the top electrode, preventing a short between the top electrode and the bottom electrode.

Embodiments of the invention are directed to a semiconductor structure. A non-limiting example of the semiconductor device includes a bottom electrode, a dielectric layer on a surface of the bottom electrode, and a top electrode on a surface of the dielectric layer. The semiconductor device further includes a spacer on a sidewall of the top electrode. The spacer is positioned on a surface of the dielectric layer such that an outer sidewall of the spacer is coplanar to a sidewall of the dielectric layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
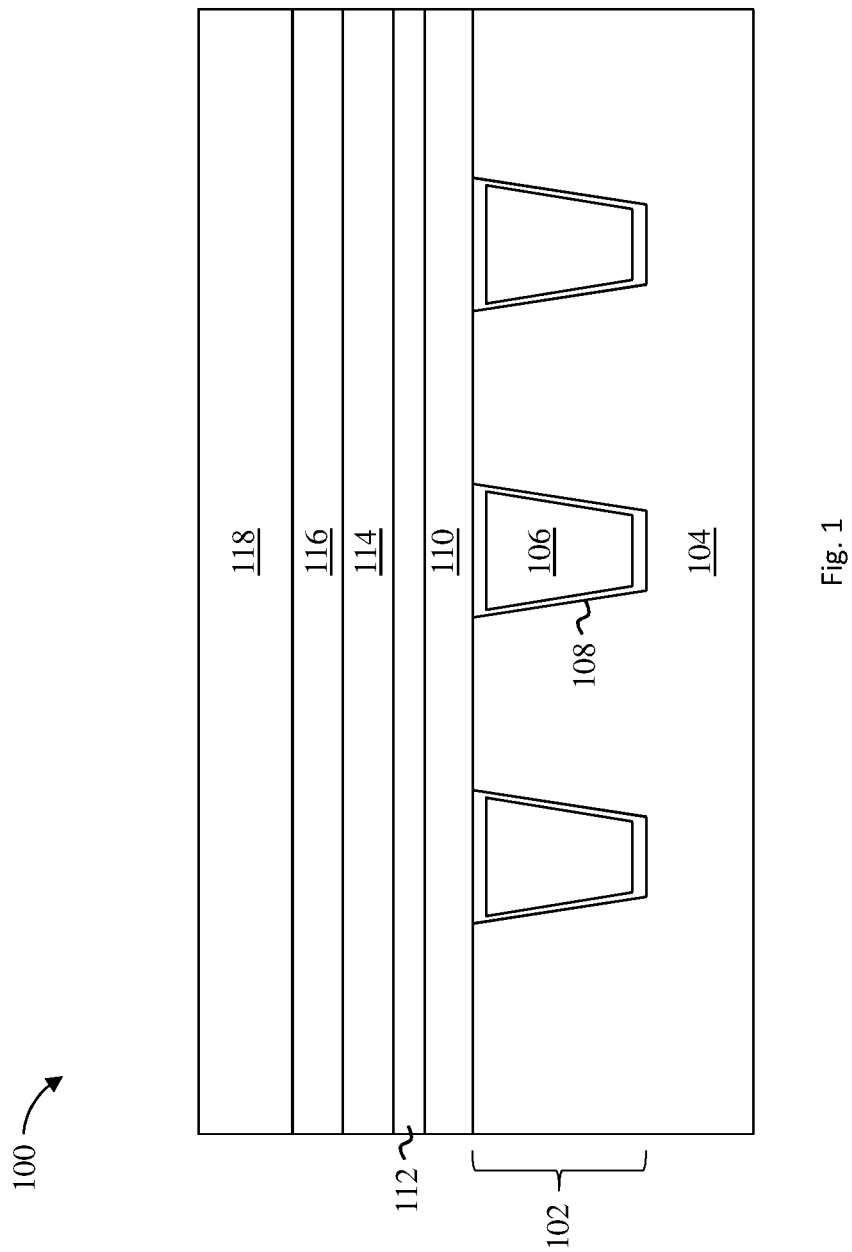
FIG. 1 depicts a cross-sectional view of a semiconductor structure after a processing operation according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as next generation nonvolatile memories such as the RRAM continue to scale, device tolerances and critical dimensions continue to shrink. Present RRAM architectures are vulnerable to electrical shorts at the device pillar edge, between the top electrode and the bottom electrode. The short generally forms during the conventional electrode RIE/redeposition process (sometimes referred to as sidewall redeposition) and can lead to low electrical yields. For example, metal-insulator-metal (MIM) RRAM stacks with nm-scale dielectric layers are highly susceptible to this failure mode.

Turning now to an overview of aspects of the present invention, one or more embodiments of the invention address the above-described shortcomings of the prior art by providing a new RRAM semiconductor structure and a method for forming an RRAM device with a spacer for electrode isolation. The method can include the formation of a dielectric spacer on the RRAM stack (memory stack) sidewall that encapsulates the top electrode post etching. The device insulator and bottom electrode can be etched/formed after the encapsulation. Advantageously, the spacer can be positioned to ensure electrical separation between the top and bottom electrodes in the RRAM stack.

Turning now to a more detailed description of aspects of the present invention, FIG. 1 depicts a cross-sectional view of a semiconductor structure 100 during an intermediate operation of a method of fabricating a final semiconductor device according to one or more embodiments of the invention. In the embodiment shown in FIG. 1, the semiconductor structure 100 includes a metal interconnect layer 102 formed in an inter-level dielectric (ILD) layer 104.

In some embodiments of the invention, the ILD layer 104 is a layer positioned within a back-end-of-line (BEOL) metallization stack (not depicted). The ILD layer 104 can be made of any suitable dielectric material, such as, for example, porous silicates, carbon doped oxides, silicon dioxides, silicon nitrides, silicon oxynitrides, silicon carbide (SiC), or other dielectric materials. Any known manner of forming the ILD layer 104 can be utilized, such as, for example, chemical vapor deposition (CVD), plasma-enhanced CVD (PECVD), atomic layer deposition (ALD), flowable CVD, spin-on dielectrics, or physical vapor deposition (PVD).

In some embodiments of the invention, the metal interconnect layer 102 includes one or more contacts or lines 106. The contacts or lines 106 can be made of any suitable conducting material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the contacts or lines 106 include copper, cobalt, or tungsten. The conductive material can further include dopants that are incorporated during or after deposition. In some embodiments of the invention, the contacts or lines 106 can include a barrier metal liner 108. Material examples include tantalum nitride and tantalum (TaN and Ta), titanium, titanium nitride, cobalt, ruthenium, and manganese. In some embodiments of the invention, the metal interconnect layer 102 includes one of a plurality of metal interconnect layers disposed between a bottom electrode 110 and an underlying semiconductor substrate (not shown).

In some embodiments of the invention, the bottom electrode 110 is formed on a surface of the metal interconnect layer 102. The bottom electrode 110 can include, for example, a metal nitride (e.g., titanium nitride (TiN) or tantalum nitride (TaN)) or a metal (e.g., titanium (Ti) or tantalum (Ta)). In some embodiments of the invention, the bottom electrode 110 includes TiN. In some embodiments of the invention, the bottom electrode 110 is formed to a thickness of 20 nm, although other thicknesses are within the contemplated scope of the invention.

In some embodiments of the invention, a dielectric layer 112 (also referred to as a dielectric data storage layer) is formed on a surface of the bottom electrode 110. The dielectric layer 112 can include a variable resistance. For example, depending on an applied voltage, the dielectric layer 112 can undergo a reversible change between a high resistance state associated with a first data state (e.g., a '0') and a low resistance state associated with a second data state (e.g., a '1'). In some embodiments of the invention, a voltage applied to the dielectric layer 112 will induce conductive paths (e.g., oxygen vacancies) to form across the dielectric layer 112, thereby reducing the resistance of the dielectric layer 112. In some embodiments of the invention, the dielectric layer 112 has a width that is greater than a width of the bottom electrode 110, so that the dielectric layer 112 extends beyond opposite sidewalls of the bottom electrode 110 (not shown).

In some embodiments of the invention, the dielectric layer 112 can include a high-k dielectric material having a variable resistance. For example, in some embodiments of the invention, the dielectric layer 112 can include hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$). In some embodiments of the invention, the dielectric layer 112 includes a metal such as titanium (Ti), hafnium (Hf), platinum (Pt), ruthenium (Ru), and/or aluminum (Al). In other embodiments of the invention, the dielectric layer 112 includes a metal oxide such as titanium oxide ($TiO_x$), hafnium oxide ($HfO_x$), zirconium oxide ($ZrO_x$), germanium oxide ($GeO_x$), and cerium oxide ($CeO_x$). In some embodiments of the invention, the dielectric layer 112 is formed to a thickness of 5-100 nm, although other thicknesses are within the contemplated scope of the invention.

In some embodiments of the invention, a capping layer (not depicted) can be disposed over the dielectric layer 112. The capping layer can be configured to store oxygen, which can facilitate resistance changes within the dielectric layer 112. In some embodiments of the invention, the capping layer includes a metal or a metal oxide that is relatively low in oxygen concentration.

In some embodiments of the invention, a top electrode 114 is formed on a surface of the dielectric layer 112. The top electrode 114 can include, for example, a metal nitride (e.g., titanium nitride or tantalum nitride) or a metal (e.g., titanium or tantalum). In some embodiments of the invention, the top electrode 114 includes titanium nitride. In some embodiments of the invention, the top electrode 114 and the bottom electrode 110 are made of a same metal or metal nitride. In some embodiments of the invention, the top electrode 114 is made of a first metal or metal nitride and the bottom electrode 110 is made of a second metal or metal nitride. In some embodiments of the invention, the top electrode 114 is formed to a thickness of 5-100 nm, although other thicknesses are within the contemplated scope of the invention.

In some embodiments of the invention, a hard mask 116 is formed on a surface of the top electrode 114. The hard mask 116 can include an oxygen containing layer, such as a silicon-oxide ($SiO_2$) layer or silicon-oxynitride (SiON) layer, a layer that is substantially devoid of oxygen, such as a silicon-nitride (SiN) layer or a silicon-carbide (SiC) layer, or a composite dielectric film that is substantially devoid of oxygen. In some embodiments of the invention, the hard mask 116 includes tantalum nitride (TaN).

In some embodiments of the invention, a hard mask 118 is formed over the hard mask 116. The hard mask 116 and the hard mask 118 can together define, for example, a two-layer hard mask. In some embodiments of the invention, the hard mask 118 includes a nitride, such as silicon nitride. In some embodiments of the invention, the hard mask 118 is formed to a thickness of 40 nm, although other thicknesses are within the contemplated scope of the invention.

The bottom electrode 110, dielectric layer 112, top electrode 114, hard mask 116, and hard mask 118 together define a memory stack (e.g., an RRAM stack). In some embodiments of the invention, the memory stack is a SiN/TaN/TiN/$HfO_2$/TiN stack, with SiN being the topmost layer and TiN being the bottommost layer.

Figure 2:
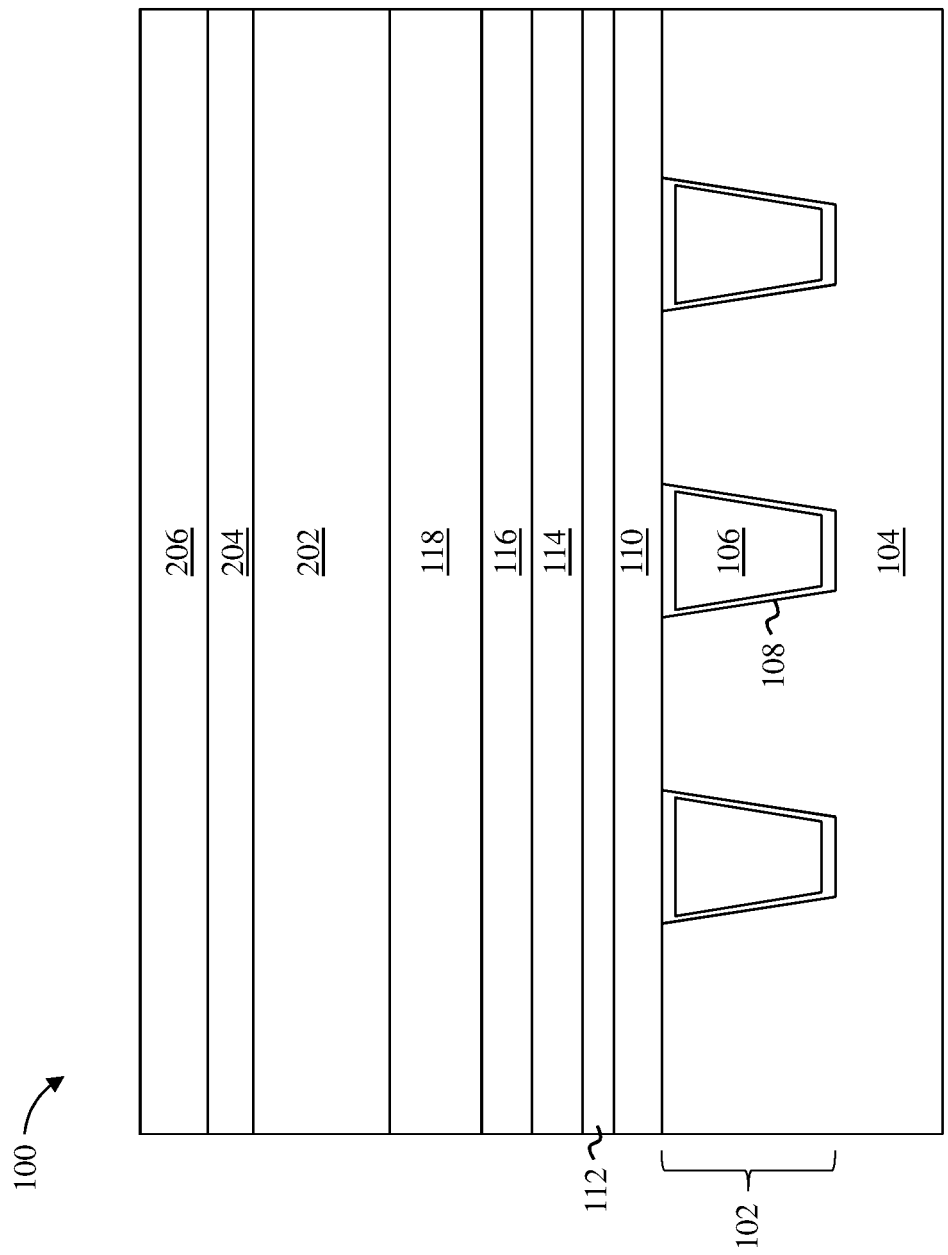
FIG. 2 depicts a cross-sectional view of a semiconductor structure after a processing operation according to one or more embodiments of the invention.

FIG. 2 depicts a cross-sectional view of the semiconductor structure 100 after a processing operation according to one or more embodiments of the invention. As illustrated in FIG. 2, a patterning film stack can be formed over the hard mask 118. In some embodiments of the invention, the film stack is a bi-layer stack, a tri-layer stack, or a multilayer stack having a topmost photoresist layer.

As depicted in FIG. 2, the film stack is a tri-layer stack having an organic planarization layer (OPL) 202, an antireflective coating 204, and a photoresist 206. Patterning film stacks typically include OPLs because high resolution photoresists themselves often do not provide enough etch resistance for pattern transfer. OPLs are used as etch masks for pattern transfers into inorganic substrates, to fill pre-existing features, and to planarize the substrate to allow for larger patterning process windows.

The OPL 202 can be formed over a surface of the hard mask 118. In some embodiments of the invention, the OPL 202 can include a photo-sensitive organic polymer having a light-sensitive material that, when exposed to electromagnetic (EM) radiation, is chemically altered and thus configured to be removed using a developing solvent. For example, the photo-sensitive organic polymer can be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the OPL 202 can include any organic polymer and a photo-active compound having a molecular structure that can attach to the molecular structure of the organic polymer. In some embodiments of the invention, the OPL 202 material is selected to be compatible with the overlying antireflective coating 204, the overlying photoresist 206, and the lithographic wavelength employed (i.e., ArF, KrF, etc.). In some embodiments, the OPL 202 can be applied using, for example, spin coating technology.

The antireflective coating 204 can be made of any suitable antireflective material, such as, for example, a low temperature oxide (LTO), SiARC, TiARC, or SiON. In some embodiments of the invention, the antireflective coating 204 is SiARC. The antireflective coating 204 can be deposited using, for example, a spin-on process. In some embodiments of the invention, the antireflective coating 204 is deposited to a thickness of about 0.5 to about 100 nm, although other thicknesses are within the contemplated scope of the invention.

The photoresist 206 can include any suitable photoresist material, such as, for example, 248 nm resists, 193 nm resists, 157 nm resists, or EUV (extreme ultraviolet) resists. In some embodiments of the invention, the photoresist 206 can be made of a light sensitive polymer, and can be deposited using any suitable resist process, such as spin-on coating.

Figure 3:
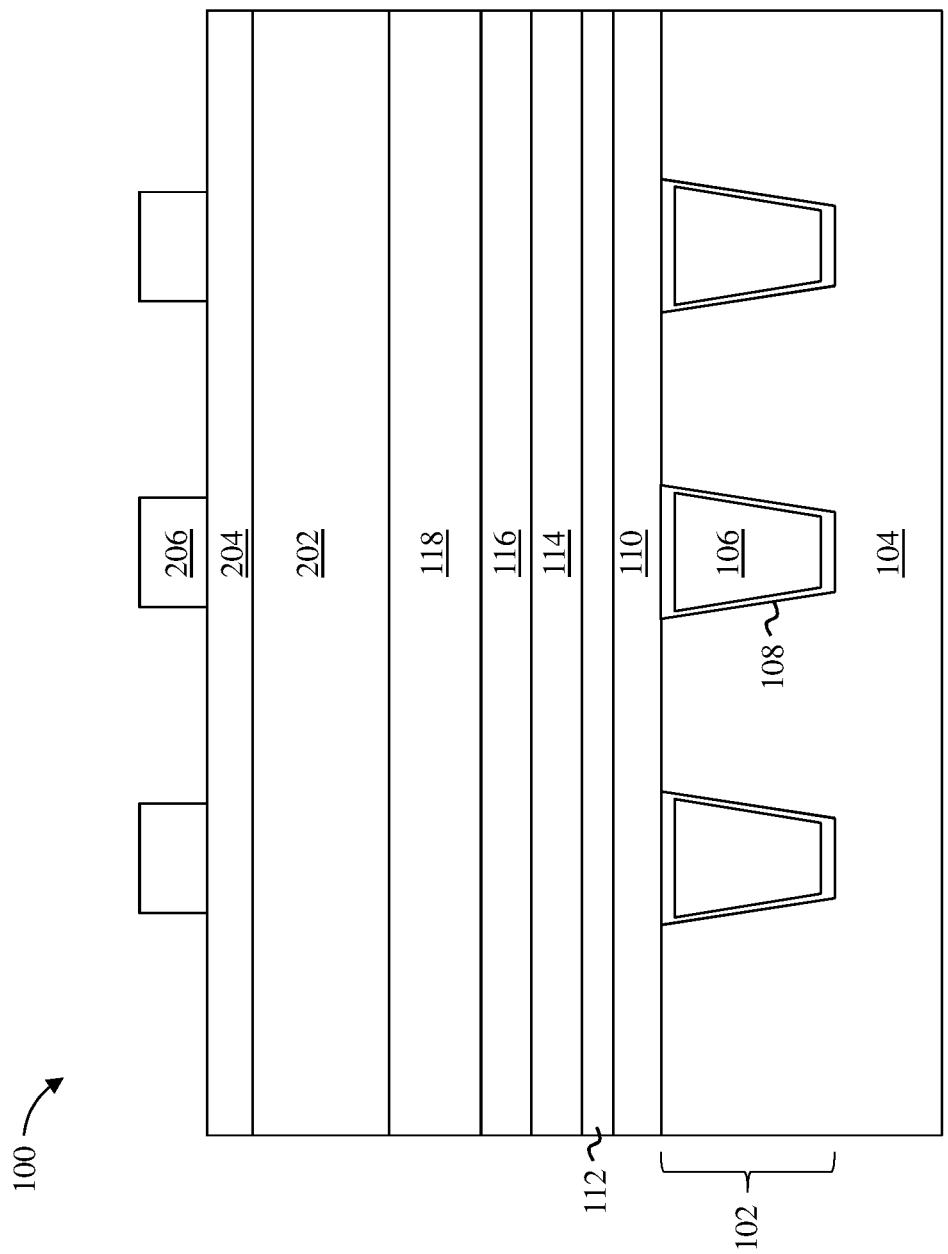
FIG. 3 depicts a cross-sectional view of a semiconductor structure after a processing operation according to one or more embodiments of the invention.

FIG. 3 depicts a cross-sectional view of the semiconductor structure 100 after a processing operation according to one or more embodiments of the invention. As illustrated in FIG. 3, the photoresist 206 can be patterned (opened) to expose a surface of the antireflective coating 204.

The photoresist 206 can be opened using any suitable process, for example, by exposure to a photo-lithography system developing solvent. The opening in the photoresist 206 defines an RRAM pillar processing window. This processing window defines the portions of the memory stack that will be removed. In other words, the portions of the photoresist 206 that remain after opening the photoresist 206 define the widths of the subsequently formed RRAM elements (see FIG. 9).

Figure 4:
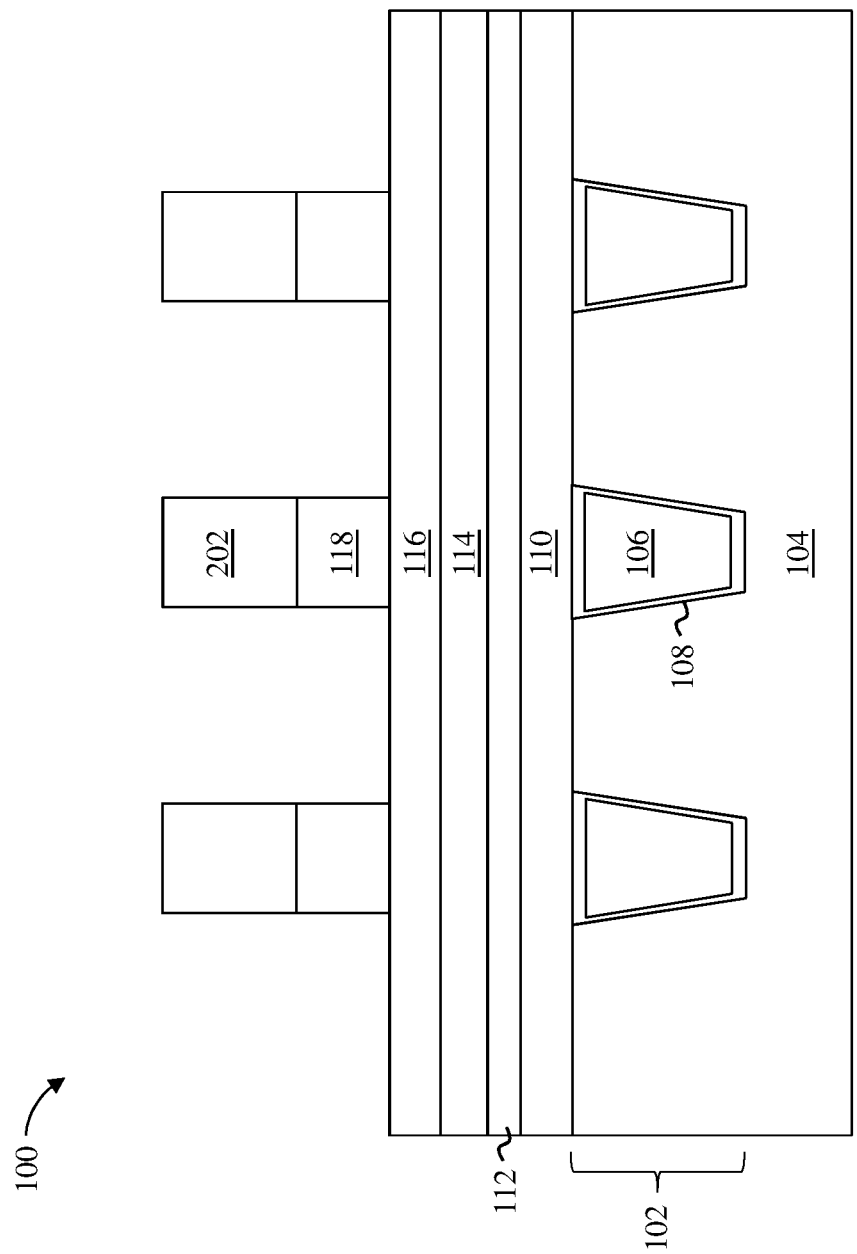
FIG. 4 depicts a cross-sectional view of a semiconductor structure after a processing operation according to one or more embodiments of the invention.

FIG. 4 depicts a cross-sectional view of the semiconductor structure 100 after a processing operation according to one or more embodiments of the invention. As illustrated in FIG. 4, the pattern in the photoresist 206 can be transferred to the underlying antireflective coating 204 using, for example, a dry etch process.

The pattern in the antireflective coating 204 can be transferred to the underlying OPL 202 using, for example, a wet etch, a dry etch, or a combination of wet and/or dry etches. In some embodiments of the invention, the OPL 202 is patterned using a RIE. In some embodiments of the invention, the photoresist 206 is removed during this OPL etch process. In some embodiments of the invention, the photoresist 206 can be removed or partially removed using an ashing process.

As further depicted in FIG. 4, the pattern can be transferred to the hard mask 118. This process is sometimes referred to as the hard mask open, and can include a wet etch process, a dry etch process, or a combination thereof. In some embodiments of the invention, the hard mask 118 is patterned using a RIE. In some embodiments of the invention, a thickness of the hard mask 118, and the corresponding hard mask open thermal budget, is defined such that the antireflective coating 204 can be completely removed during the hard mask open without recessing the underlying hard mask 116. In other words, the hard mask open can be tuned to land softly on the hard mask 116 (e.g., softly on TaN).

Figure 5:
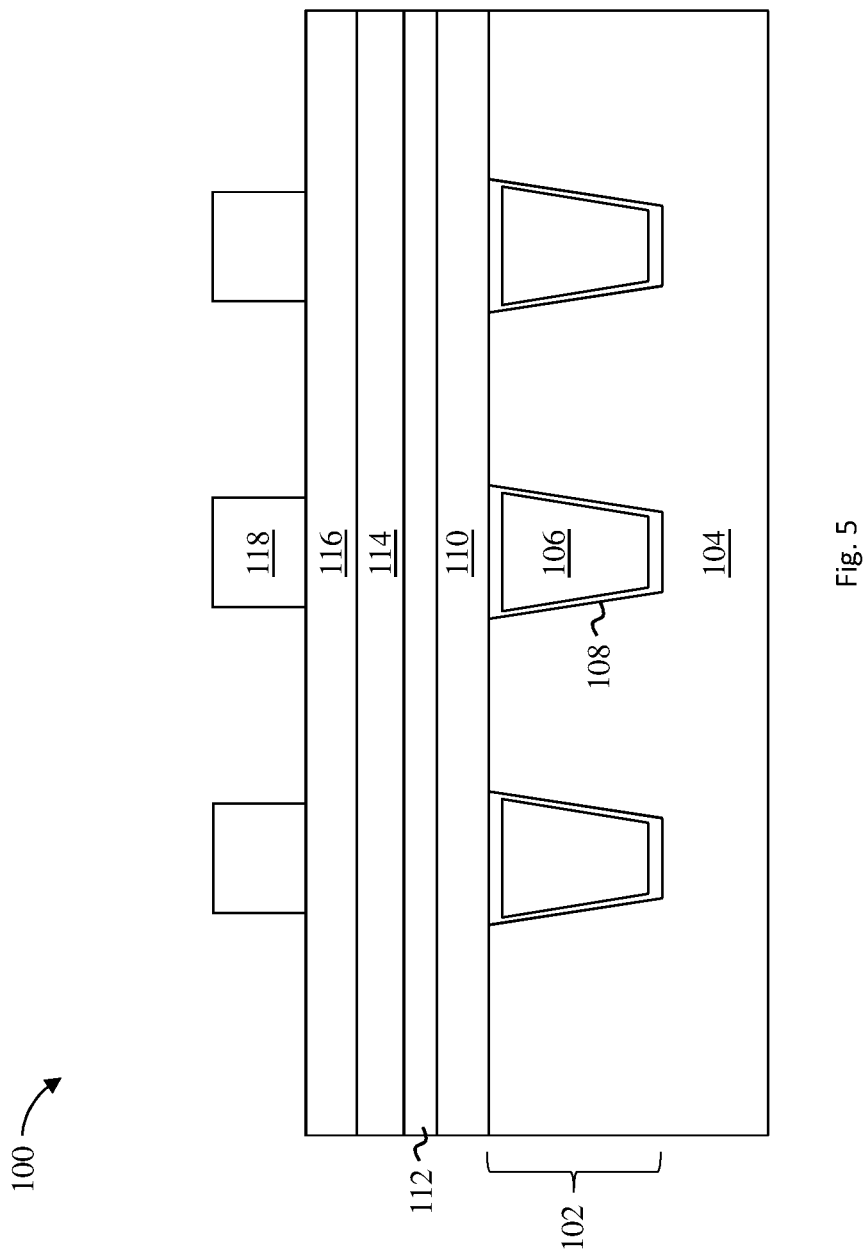
FIG. 5 depicts a cross-sectional view of a semiconductor structure after a processing operation according to one or more embodiments of the invention.

FIG. 5 depicts a cross-sectional view of the semiconductor structure 100 after a processing operation according to one or more embodiments of the invention. As illustrated in FIG. 5, the OPL 202 can be removed following the hard mask open. The OPL 202 can be removed using, for example, a dry removal process, such as a RIE or plasma ash. In some embodiments of the invention, the OPL 202 is removed using an oxygen-based ashing process. In some embodiments of the invention, the OPL 202 is removed using a nitrogen and hydrogen ($N_2/H_2$) based ashing process.

Figure 6:
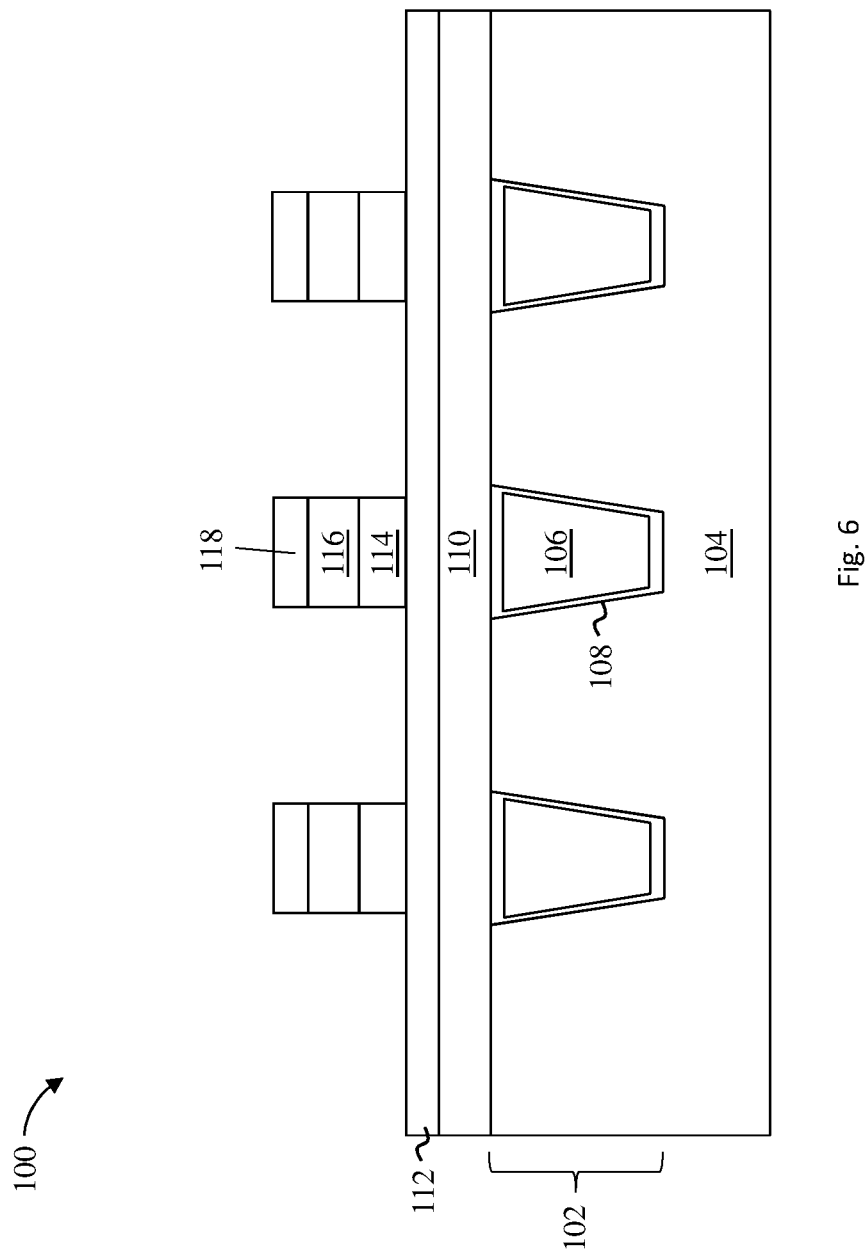
FIG. 6 depicts a cross-sectional view of a semiconductor structure after a processing operation according to one or more embodiments of the invention.

FIG. 6 depicts a cross-sectional view of the semiconductor structure 100 after a processing operation according to one or more embodiments of the invention. As illustrated in FIG. 6, the hard mask 118 pattern can be transferred to the underlying hard mask 116 and top electrode 114. The hard mask 116 and top electrode 114 can be patterned using, for example, a wet etch, a dry etch, or a combination of wet and/or dry etches. In some embodiments of the invention, the hard mask 116 and top electrode 114 are patterned using a RIE. In this manner, a top surface of the dielectric layer 112 is exposed.

In some embodiments of the invention, this etching process results in a recessing (partial etch) of the hard mask 118. In some embodiments of the invention, the hard mask 118 will be recessed about 40 nm during the hard mask 116 and top electrode 114 etch. In some embodiments of the invention, an oxide break-through step is used prior to etching the hard mask 116 and top electrode 114. For example, a TaN oxide break-through can be used when the hard mask 116 is made of TaN and the top electrode 114 is made of TiN.

Figure 7:
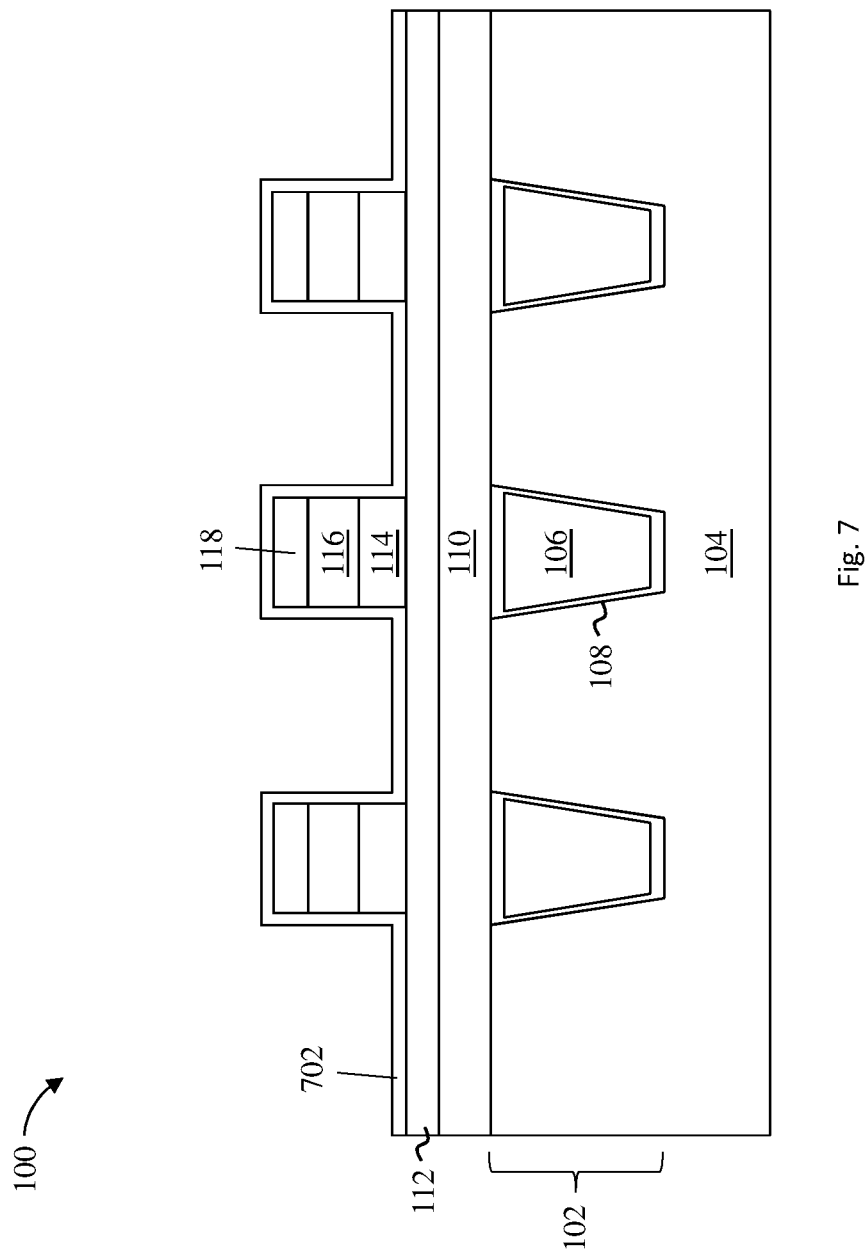
FIG. 7 depicts a cross-sectional view of a semiconductor structure after a processing operation according to one or more embodiments of the invention.

FIG. 7 depicts a cross-sectional view of the semiconductor structure 100 after a processing operation according to one or more embodiments of the invention. As illustrated in FIG. 7, a spacer layer 702 (also referred to as an encapsulation layer) can be formed on the dielectric layer 112 and the hard mask 118.

In some embodiments of the invention, the spacer layer 702 is formed using CVD, PECVD, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), ALD, PVD, chemical solution deposition, or other like process. For example, spacer material can be directionally, conformally, or bulk deposited over exposed surfaces of the semiconductor structure 100.

In some embodiments of the invention, the spacer layer 702 is conformally deposited over sidewalls of the hard mask 116 and top electrode 114 using, for example, ALD, although other conformal deposition processes are within the contemplated scope of the invention. The spacer layer 702 can be made of any suitable dielectric material, such as, for example, a low-k dielectric, a nitride, silicon nitride, silicon oxide, SiON, SiC, SiOCN, or SiBCN. A low-k dielectric can include a dielectric material having a dielectric constant less than the dielectric constant of silicon dioxide (e.g., less than about 3.9). The spacer layer 702 can be formed to a nominal (conformal) thickness of about 30 nm or less, or 5 nm or less, although other thicknesses are within the contemplated scope of the invention.

Figure 8:
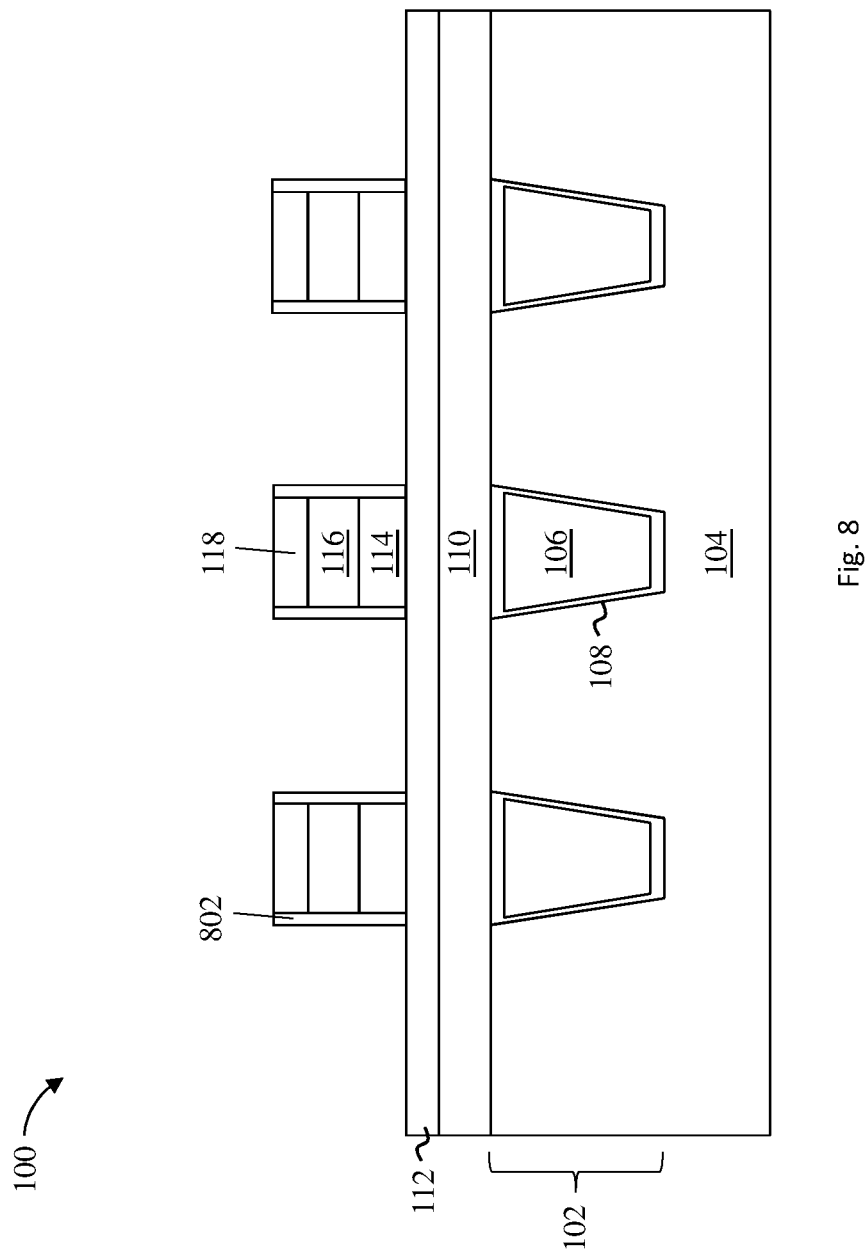
FIG. 8 depicts a cross-sectional view of a semiconductor structure after a processing operation according to one or more embodiments of the invention.

FIG. 8 depicts a cross-sectional view of the semiconductor structure 100 after a processing operation according to one or more embodiments of the invention. As illustrated in FIG. 8, portions of the spacer layer 702 can be removed such that remaining portions of the spacer layer 702 define one or more spacers 802.

The spacer layer 702 can be partially removed using, for example, an etch back process, to expose a surface of the dielectric layer 112 and the hard mask 118. In some embodiments of the invention, the spacer layer 702 is etched selective to the dielectric layer 112 and/or the hard mask 118.

Figure 9:
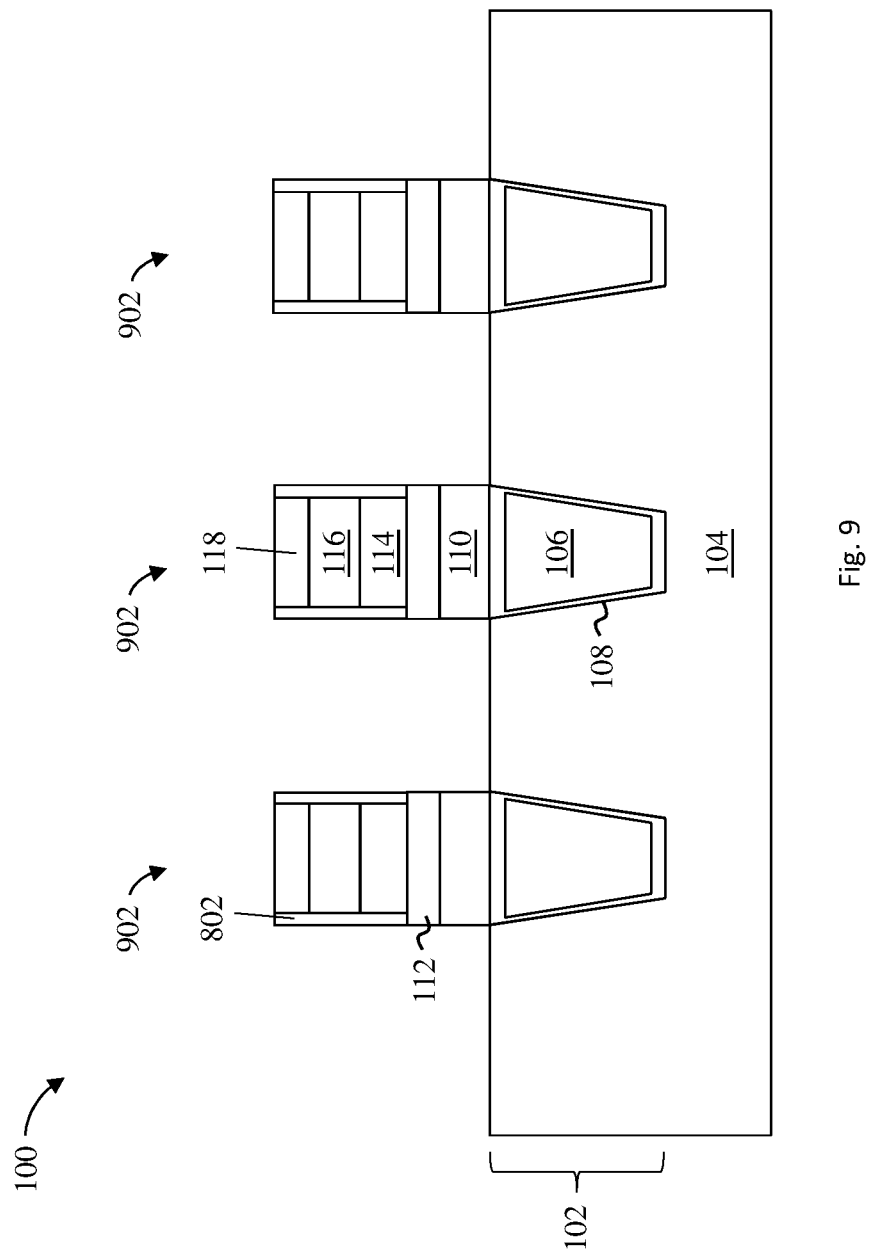
FIG. 9 depicts a cross-sectional view of a semiconductor structure after a processing operation according to one or more embodiments of the invention.

FIG. 9 depicts a cross-sectional view of the semiconductor structure 100 after a processing operation according to one or more embodiments of the invention. As illustrated in FIG. 9, exposed portions of the dielectric layer 112 and the bottom electrode 110 can be removed to define one or more RRAM elements 902. In some embodiments of the invention, the exposed portions of the dielectric layer 112 and the bottom electrode 110 are removed using a dry etch, without introducing any wets to the clean surface of the RRAM elements 902.

As depicted in FIG. 9, each of the RRAM element(s) 902 includes a patterned portion of the hard mask 118, the hard mask 116, the top electrode 114, the dielectric layer 112, the bottom electrode 110, and the spacers 802. As discussed previously herein, the spacers 802, formed on sidewalls of the top electrode 114, prevent a short between the top electrode 114 and the bottom electrode 110.

Figure 10:
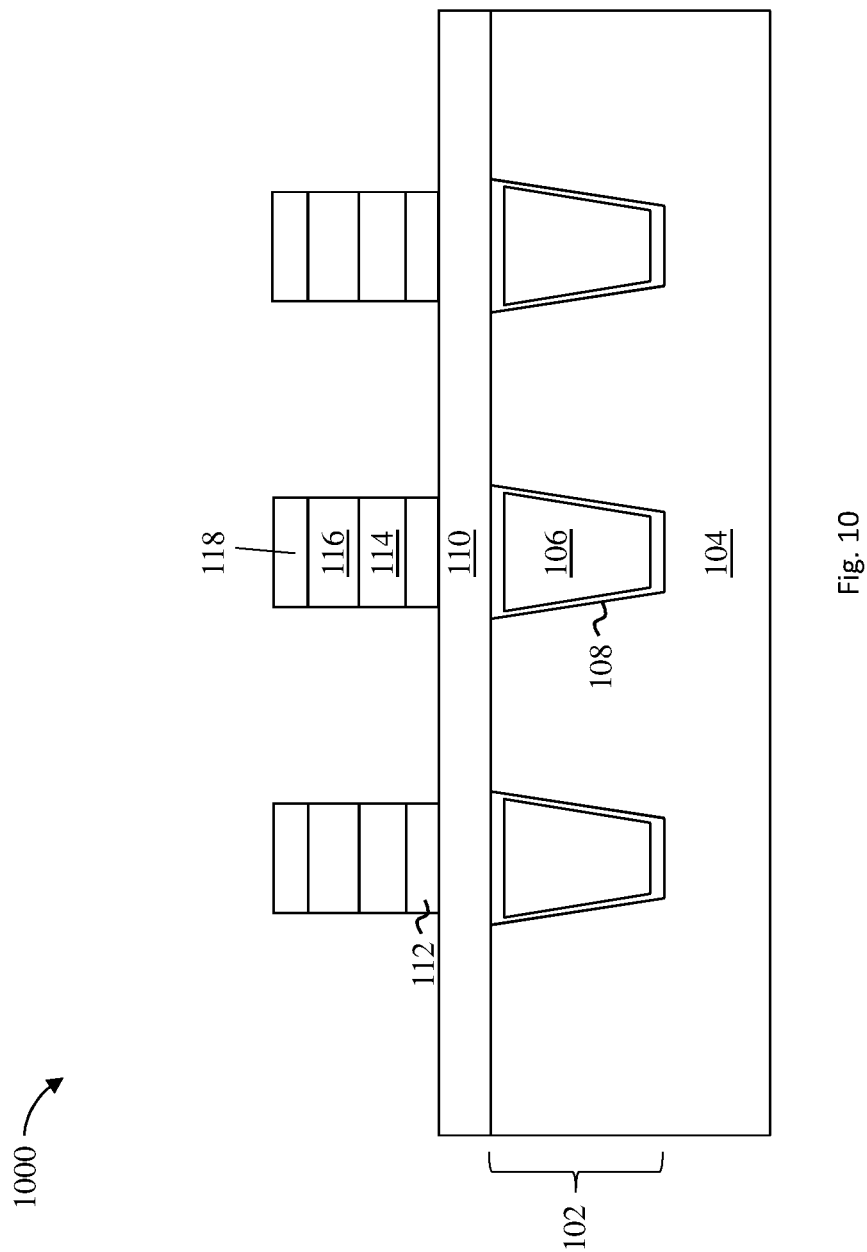
FIG. 10 depicts a cross-sectional view of a semiconductor structure after a processing operation according to one or more embodiments of the invention.

FIG. 10 depicts a cross-sectional view of a semiconductor structure 1000 after a processing operation according to one or more embodiments of the invention. FIG. 10 illustrates an alternative embodiment to FIGS. 1-9, whereby the spacer formation occurs after the dielectric layer RIE. In some embodiments of the invention, the process operations depicted with respect to FIG. 10 follow those shown with respect to FIG. 6.

As illustrated in FIG. 10, the hard mask 118 pattern can be transferred to the underlying dielectric layer 112 after or while patterning the hard mask 116 and the top electrode 114. The dielectric layer 112 can be patterned using, for example, a wet etch, a dry etch, or a combination of wet and/or dry etches. In some embodiments of the invention, the dielectric layer 112 is patterned using a RIE. In this manner, a top surface of the bottom electrode 110 is exposed.

Figure 11:
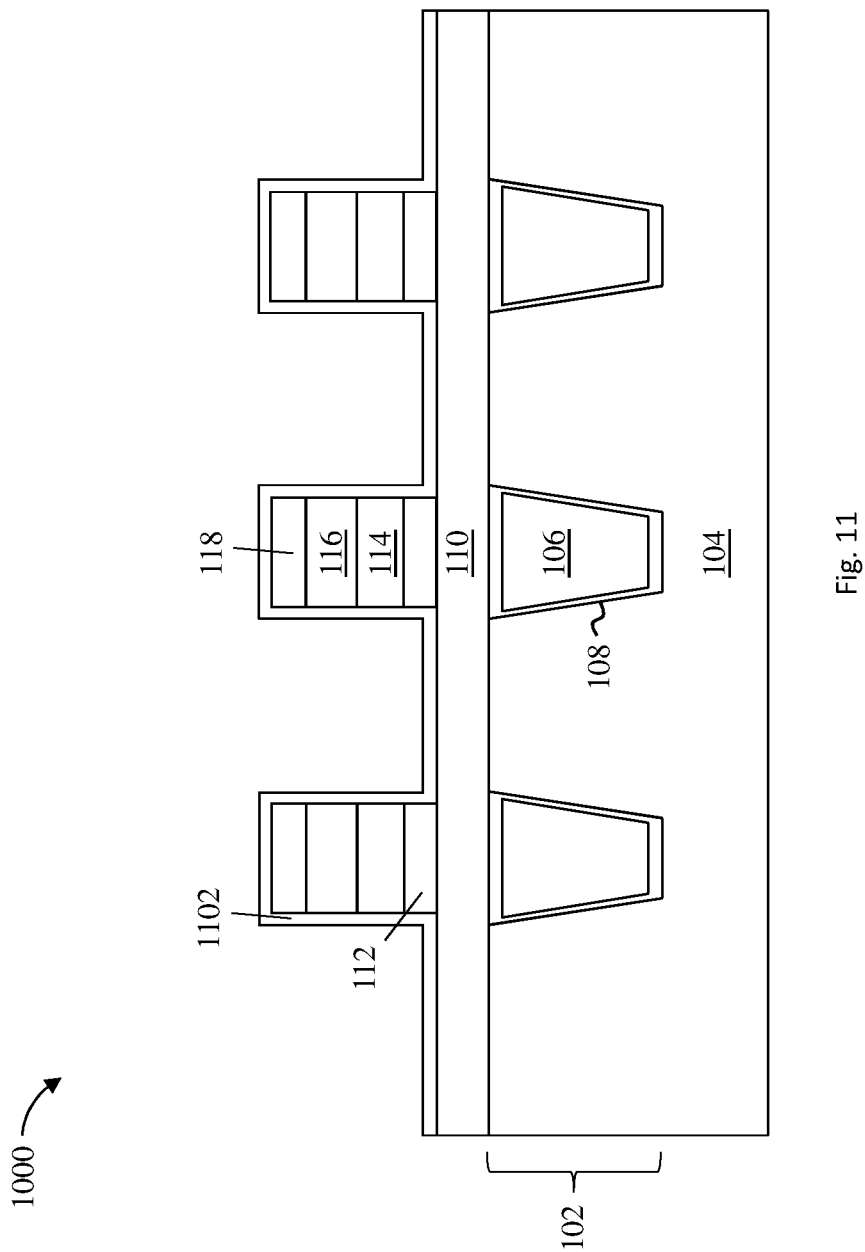
FIG. 11 depicts a cross-sectional view of a semiconductor structure after a processing operation according to one or more embodiments of the invention.

FIG. 11 depicts a cross-sectional view of the semiconductor structure 1000 after a processing operation according to one or more embodiments of the invention. As illustrated in FIG. 11, a spacer layer 1102 (also referred to as an encapsulation layer) can be formed on the bottom electrode 110 and the hard mask 118.

In some embodiments of the invention, the spacer layer 1102 is formed using CVD, PECVD, UHVCVD, RTCVD, MOCVD, LPCVD, LRPCVD, ALD, PVD, chemical solution deposition, or other like process. For example, spacer material can be directionally, conformally, or bulk deposited over exposed surfaces of the semiconductor structure 1000.

In some embodiments of the invention, the spacer layer 1102 is conformally deposited over sidewalls of the hard mask 116, the top electrode 114, and the dielectric layer 112 using, for example, ALD, although other conformal deposition processes are within the contemplated scope of the invention. The spacer layer 1102 can be made of any suitable dielectric material, such as, for example, a low-k dielectric, a nitride, silicon nitride, silicon oxide, SiON, SiC, SiOCN, or SiBCN. A low-k dielectric can include a dielectric material having a dielectric constant less than the dielectric constant of silicon dioxide (e.g., less than about 3.9). The spacer layer 1102 can be formed to a nominal (conformal) thickness of about 30 nm or less, or 5 nm or less, although other thicknesses are within the contemplated scope of the invention.

Figure 12:
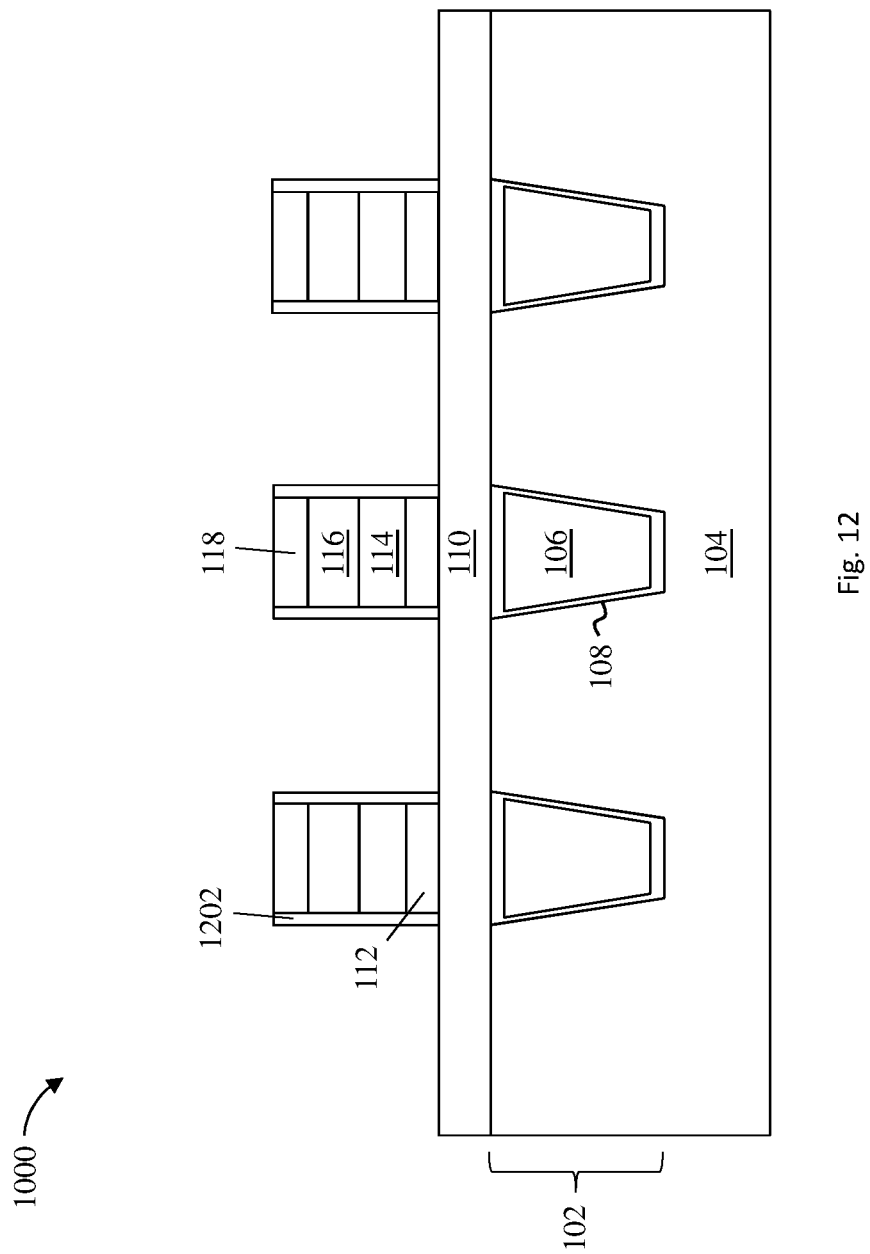
FIG. 12 depicts a cross-sectional view of a semiconductor structure after a processing operation according to one or more embodiments of the invention.

FIG. 12 depicts a cross-sectional view of the semiconductor structure 1000 after a processing operation according to one or more embodiments of the invention. As illustrated in FIG. 12, portions of the spacer layer 1102 can be removed such that remaining portions of the spacer layer 1102 define one or more spacers 1202.

The spacer layer 1102 can be partially removed using, for example, an etch back process, to expose a surface of the bottom electrode 110 and the hard mask 118. In some embodiments of the invention, the spacer layer 1102 is etched selective to the bottom electrode 110 and/or the hard mask 118.

Figure 13:
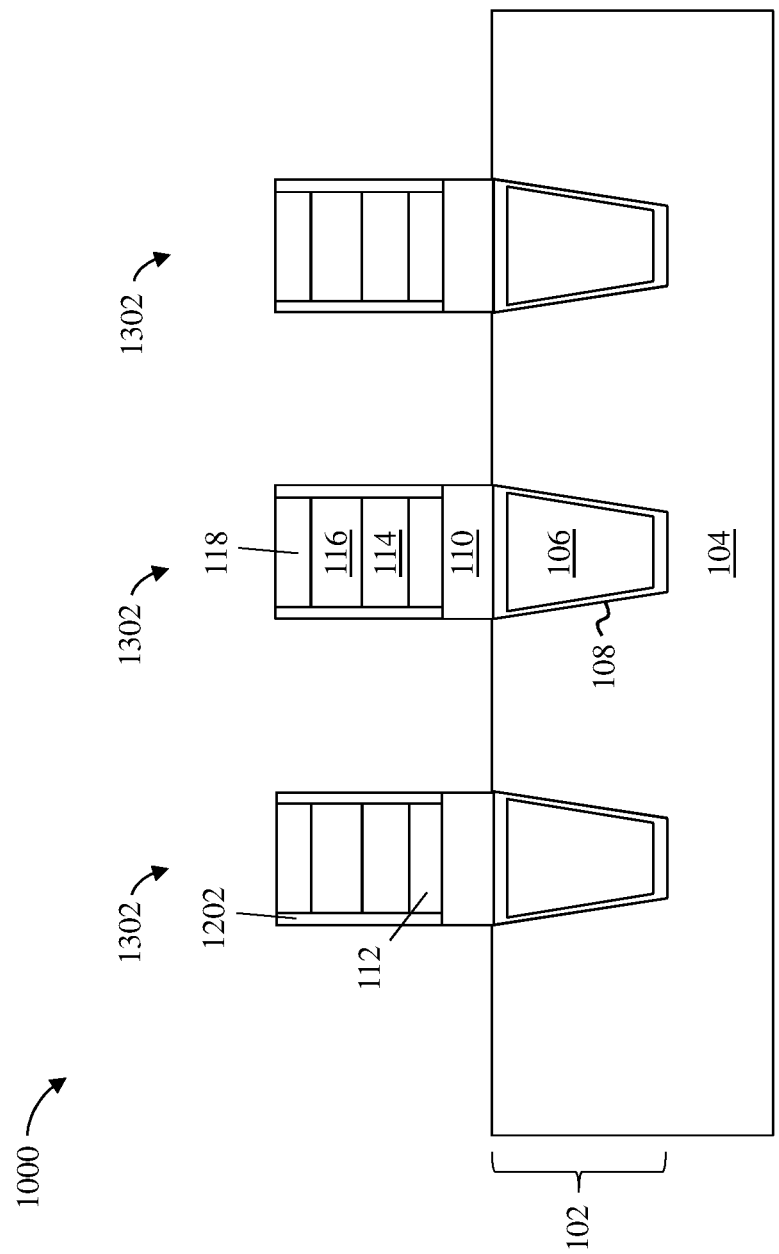
FIG. 13 depicts a cross-sectional view of a semiconductor structure after a processing operation according to one or more embodiments of the invention.

FIG. 13 depicts a cross-sectional view of the semiconductor structure 1000 after a processing operation according to one or more embodiments of the invention. As illustrated in FIG. 13, exposed portions of the bottom electrode 110 can be removed to define one or more RRAM elements 1302. In some embodiments of the invention, the exposed portions of the bottom electrode 110 are removed using a dry etch, without introducing any wets to the clean surface of the RRAM elements 1302.

As depicted in FIG. 13, each of the RRAM element(s) 1302 includes a patterned portion of the hard mask 118, the hard mask 116, the top electrode 114, the dielectric layer 112, the bottom electrode 110, and the spacers 1202. As discussed previously herein, the spacers 1202, formed on sidewalls of the top electrode 114, prevent a short between the top electrode 114 and the bottom electrode 110.

Figure 14:
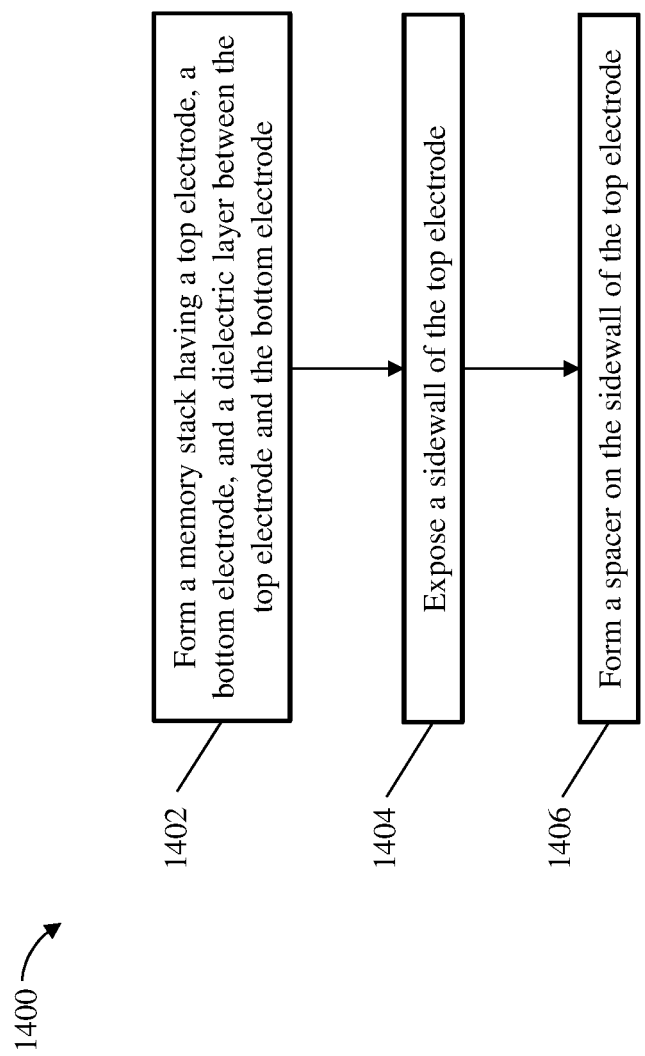
FIG. 14 depicts a flow diagram illustrating a method according to one or more embodiments of the invention.

FIG. 14 depicts a flow diagram 1400 illustrating a method for forming a semiconductor device according to one or more embodiments of the invention. As shown at block 1402, a memory stack is formed. The memory stack can include a top electrode, a bottom electrode, and a dielectric layer between the top electrode and the bottom electrode. The memory stack can be formed in a similar manner as the stack depicted in FIG. 1. In some embodiments of the invention, the memory stack is formed on a surface of a metal interconnect layer. In some embodiments of the invention, the metal interconnect layer is formed in an inter-level dielectric over a substrate.

At block 1404, a portion of the memory stack is removed to expose a sidewall of the top electrode. The memory stack can be patterned in a similar manner as discussed previously herein with respect to FIG. 6. In some embodiments of the invention, removing a portion of the memory stack to expose a sidewall of the top electrode further exposes a surface of the dielectric layer.

At block 1406, a spacer is formed on the sidewall of the top electrode. The spacer can be formed in a similar manner as the spacer 802 discussed previously herein with respect to FIGS. 7 and 8. In some embodiments of the invention, the spacer is formed by conformally depositing and etching a spacer layer. The spacer physically prevents a short between the top electrode and the bottom electrode.

The method can further include removing a portion of the dielectric layer and the bottom electrode such that a sidewall of the dielectric layer, a sidewall of the bottom electrode, and a sidewall of the spacer are coplanar.

Figure 15:
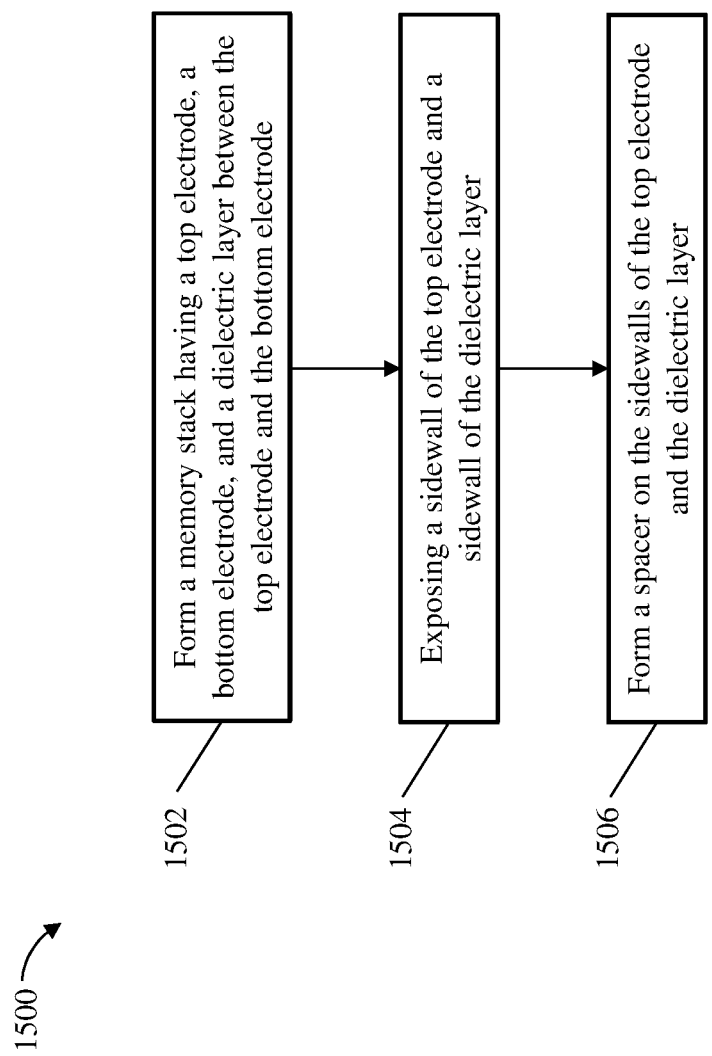
FIG. 15 depicts a flow diagram illustrating a method according to one or more embodiments of the invention.

FIG. 15 depicts a flow diagram 1500 illustrating a method for forming a semiconductor device according to one or more embodiments of the invention. As shown at block 1502, a memory stack is formed. The memory stack can include a top electrode, a bottom electrode, and a dielectric layer between the top electrode and the bottom electrode. The memory stack can be formed in a similar manner as the stack depicted in FIG. 10. In some embodiments of the invention, the memory stack is formed on a surface of a metal interconnect layer. In some embodiments of the invention, the metal interconnect layer is formed in an inter-level dielectric over a substrate.

At block 1504, a portion of the memory stack is removed to expose a sidewall of the top electrode and a sidewall of the dielectric layer. The memory stack can be patterned in a similar manner as discussed previously herein with respect to FIG. 10. In some embodiments of the invention, removing a portion of the memory stack to expose a sidewall of the top electrode and a sidewall of the dielectric layer further exposes a surface of the bottom electrode.

At block 1506, a spacer is formed on the sidewalls of the top electrode and the dielectric layer. The spacer can be formed in a similar manner as the spacer 1202 discussed previously herein with respect to FIGS. 11 and 12. In some embodiments of the invention, the spacer is formed by conformally depositing and etching a spacer layer. In some embodiments of the invention, forming the spacer includes forming a spacer layer on the sidewall of the top electrode, the sidewall of the dielectric layer, and the exposed surface of the bottom electrode. The spacer physically prevents a short between the top electrode and the bottom electrode.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a metal interconnect layer on a substrate;
    forming a memory stack on the metal interconnect layer, the memory stack comprising a top electrode, a bottom electrode, and a dielectric layer between the top electrode and the bottom electrode, wherein a bottommost surface of the bottom electrode is in direct contact with the metal interconnect layer;
    forming a first hard mask on the top electrode, the first hard mask comprising a metal nitride;
    forming a second hard mask on the first hard mask, the second hard mask comprising a silicon nitride;
    patterning the second hard mask, wherein a thickness of the second hard mask and a corresponding hard mask open thermal budget is defined such that the second hard mask is patterned without recessing the first hard mask;
    transferring a pattern in the second hard mask to the first hard mask and the top electrode, wherein transferring the pattern to the first hard mask results in partially recessing the second hard mask, wherein an oxide break-through occurs prior to transferring the pattern to the first hard mask;
    exposing a sidewall of the top electrode;
    forming an encapsulation layer on the exposed sidewall of the top electrode and on a topmost surface of the dielectric layer;
    removing a portion of the encapsulation layer to expose the topmost surface of the dielectric layer, wherein remaining portions of the encapsulation layer define a spacer on the sidewall of the top electrode, and wherein a bottommost surface of the spacer is directly on the topmost surface of the dielectric layer.

2. The method of claim 1 further comprising removing a portion of the dielectric layer and the bottom electrode such that a sidewall of the dielectric layer, a sidewall of the bottom electrode, and a sidewall of the spacer are coplanar.

3. The method of claim 1, wherein the spacer prevents a short between the top electrode and the bottom electrode.

4. The method of claim 1, wherein the metal interconnect layer is formed in an inter-level dielectric over the substrate.

5. The method of claim 1, wherein exposing the sidewall of the top electrode comprises removing a portion of the memory stack, which further exposes a surface of the dielectric layer.

6. A method for forming a semiconductor device, the method comprising:
    forming a metal interconnect layer on a substrate;
    forming a memory stack on the metal interconnect layer, the memory stack comprising a top electrode, a bottom electrode, and a dielectric layer between the top electrode and the bottom electrode, wherein a bottommost surface of the bottom electrode is in direct contact with the metal interconnect layer;
    forming a first hard mask on the top electrode, the first hard mask comprising a metal nitride;
    forming a second hard mask on the first hard mask, the second hard mask comprising a silicon nitride;
    patterning the second hard mask, wherein a thickness of the second hard mask and a corresponding hard mask open thermal budget is defined such that the second hard mask is patterned without recessing the first hard mask;
    transferring a pattern in the second hard mask to the first hard mask, the top electrode, and the dielectric layer to expose a sidewall of the top electrode and a sidewall of the dielectric layer, wherein transferring the pattern to the first hard mask results in partially recessing the second hard mask, wherein an oxide break-through occurs prior to transferring the pattern to the first hard mask;
    forming an encapsulation layer on sidewalls of the first hard mask, the exposed sidewall of the top electrode, and on the exposed sidewall of the dielectric layer, the encapsulation layer directly on a topmost surface of the bottom electrode;

removing a portion of the encapsulation layer to expose the topmost surface of the bottom electrode, wherein remaining portions of the encapsulation layer define a spacer on the sidewalls of the first hard mask, the sidewalls of the top electrode and the sidewalls of the dielectric layer, and wherein a bottommost surface of the spacer is directly on the topmost surface of the bottom electrode.

7. The method of claim 6 further comprising removing a portion of the bottom electrode such that a sidewall of the bottom electrode and a sidewall of the spacer are coplanar.

8. The method of claim 6, wherein the spacer prevents a short between the top electrode and the bottom electrode.

9. The method of claim 6, wherein the metal interconnect layer is formed in an inter-level dielectric over the substrate.

10. The method of claim 6, wherein exposing the sidewall of the top electrode and the sidewall of the dielectric layer comprises removing a portion of the memory stack, which further exposes a surface of the bottom electrode.

\* \* \* \* \*